US010643694B1

(12) United States Patent
Alessandri et al.

(10) Patent No.: US 10,643,694 B1
(45) Date of Patent: May 5, 2020

(54) PARTIAL-POLARIZATION RESISTIVE ELECTRONIC DEVICES, NEURAL NETWORK SYSTEMS INCLUDING PARTIAL-POLARIZATION RESISTIVE ELECTRONIC DEVICES AND METHODS OF OPERATING THE SAME

(71) Applicant: University of Notre Dame du Lac, South Bend, IN (US)

(72) Inventors: Cristobal Alessandri, Notre Dame, IN (US); Erich Kinder, Notre Dame, IN (US); Alan C. Seabaugh, Notre Dame, IN (US)

(73) Assignee: University of Notre Dame du Lac, South Bend, IN (US)

( * ) Notice: Subject to any disclaimer, the term of this patent is extended or adjusted under 35 U.S.C. 154(b) by 0 days.

(21) Appl. No.: 16/180,453

(22) Filed: Nov. 5, 2018

(51) Int. Cl.
*G11C 13/00* (2006.01)
*G06N 3/063* (2006.01)
*H01L 45/00* (2006.01)
*G06N 3/04* (2006.01)

(52) U.S. Cl.
CPC ............. *G11C 13/004* (2013.01); *G06N 3/04* (2013.01); *G06N 3/0635* (2013.01); *G11C 13/0004* (2013.01); *H01L 45/147* (2013.01); *G11C 2213/73* (2013.01)

(58) Field of Classification Search
None
See application file for complete search history.

(56) References Cited

U.S. PATENT DOCUMENTS

| | | | |
|---|---|---|---|
| 6,760,246 B1 * | 7/2004 | Kamp | G11C 11/22 365/145 |
| 10,395,745 B2 * | 8/2019 | Horch | H01L 29/7833 |
| 2017/0249983 A1 * | 8/2017 | Park | G11C 11/2275 |

OTHER PUBLICATIONS

Chatterjee et al., "Self-Aigned, Gate Last, FDSOI, Ferroelectric Gate Memory Devices With 5.5-nm $Hf_{0.8}Zr_{0.2}O_2$, High Endurance and Breakdown Recovery," IEEE Electron Device Letters, vol. 38, No. 10, Oct. 10, 2017, pp, 1379-1382.
Lewis-Kraus, Gideon, "The Great A.I Awakening," The New York Times, Dec. 14, 2016, 38 pages.
Tayfun Gokmen, et al; *Acceleration of Deep Nreural Nrtwork Training with Resistive Cross-Point Devices: Design Consdierations*; Fronties in Neuroscience; vol. 10; Article 333; Jul. 21, 2016; pp. 1-13.

(Continued)

*Primary Examiner* — Douglas King
(74) *Attorney, Agent, or Firm* — Stanek Lemon Crouse & Meeks, P.A.

(57) ABSTRACT

An electronic device can include a semiconductor material including a channel region configured to conduct a current, a source contact electrically coupled to the channel region at a first location, a drain contact electrically coupled to the channel region at a second location spaced apart from the first location, a partial-polarization material on the semiconductor material between the source contact and the drain contact opposite the channel region and a gate contact on the partial-polarization material opposite the channel region and ohmically coupled to the drain contact or ohmically coupled to the source contact.

20 Claims, 10 Drawing Sheets

(56) References Cited

OTHER PUBLICATIONS

Geoffrey W. Burr, et al; *Neuromorphic Computing using Non-Volatile Memory*, Advances in Physics: X;vol. 2 No. 1; 2016; pp. 89-124.
Shimeng Yu: *Neuro-Inspired Computing With Emerging Nonvolatile Memory*; IEEE; vol. 106, No. 2, Feb. 2018; pp. 260-285.
Matthew Jerry et al. *Ferroelectric FET Analog Synapse for Acceleration of Deep Neural Network Training*; 2017; pp. 6.21-6.2.4.

* cited by examiner

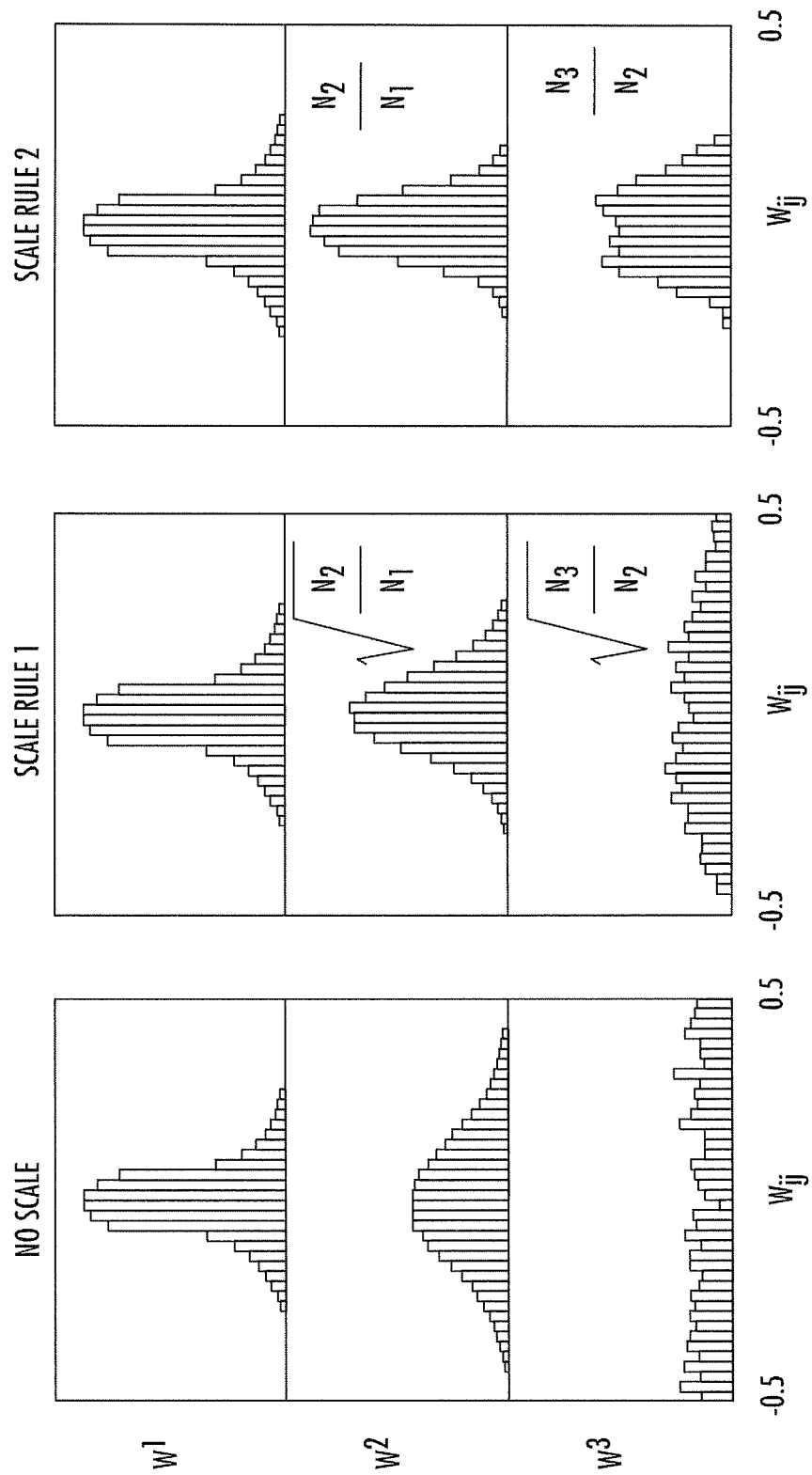

| | IDEAL RPU [3] | PRPOSED RPU | | PCM [10] | | CMOS RPU [9] |
|---|---|---|---|---|---|---|
| TEST ERROR [%] | 2.3 | 2.14 | 2.62 | 3 | 20 | 2-3 |
| LEVELS | >1000 | 4000 | 1000 | ~1000 | | >1000 |
| ASYMMETRY | BELOW 5% | 20 TO 50% | | NONE | LARGE | LARGER |
| AREA [$\mu M^2$] | 0.04 | 0.36 | 0.09 | NOT SPECIFIED | | |

FIG. 16

PARTIAL-POLARIZATION RESISTIVE ELECTRONIC DEVICES, NEURAL NETWORK SYSTEMS INCLUDING PARTIAL-POLARIZATION RESISTIVE ELECTRONIC DEVICES AND METHODS OF OPERATING THE SAME

STATEMENT OF GOVERNMENT SUPPORT

This invention was made with government funds under Agreement No HR0011-13-3-0002 awarded by the Defense Advanced Research Projects Agency (DARPA) and Award Grant No. ECCS1631717 awarded by the National Science Foundation. The U.S. Government has certain rights in the invention.

FIELD

The present invention relates to the field of electronics in general, and more particularly, to resistive-based memory devices.

BACKGROUND

Deep Neural Networks (DNN) can perform cognitive tasks such as speech recognition, drug discovery and object detection with high accuracy and efficiency. Training a DNN, however, can be an energy- and time-consuming task. Hardware-based accelerators have the potential to out-perform software implementations. A synaptic element of the DNN can be important in this type of approach.

It has been proposed to utilize a nonvolatile memory with multilevel conductance that can perform a weight update operation by stochastic multiplication as the synaptic element to provide a Resistive Processing Unit (RPU). Such an RPU, may require 1000 levels of conductance with an increase/decrease systematic mismatch below 5%, which may be difficult to accomplish with phase-change memory (PCM) and resistive random access memory (RRAM) due to their fundamental asymmetry.

SUMMARY

Embodiments according to the invention can provide partial-polarization resistive electronic devices, neural network systems including partial-polarization resistive electronic devices and methods of operating the same. Pursuant to these embodiments, an electronic device can include a semiconductor material including a channel region configured to conduct a current, a source contact electrically coupled to the channel region at a first location, a drain contact electrically coupled to the channel region at a second location spaced apart from the first location, a partial-polarization material on the semiconductor material between the source contact and the drain contact opposite the channel region and a gate contact on the partial-polarization material opposite the channel region and ohmically coupled to the drain contact or ohmically coupled to the source contact.

In some embodiments, a method of programming an electronic device can be provided by applying a programming voltage pulse or sequence of pulses between a drain contact and a source contact to set a partial-polarization state of a partial-polarization material opposite a channel region of the electronic device and applying a read voltage pulse to generate a current in the channel region responsive to the partial-polarization state.

In some embodiments, a neural network circuit can include a plurality of serially connected layers of the neural network circuit, wherein each layer includes a respective plurality of neurons, a plurality of resistive processing cross-bar circuits, wherein each of the resistive processing cross-bar circuits is connected between directly adjacent ones of the serially connected layers to provide a respective weighting to data provided from the respective plurality of neurons included in an upstream layer of the neural network circuit that is summed by a down-stream layer of the neural network circuit and each of the resistive processing cross-bar circuits comprises a respective array of partial-polarization electronic devices each being arranged in a diode-connected configuration.

BRIEF DESCRIPTION OF THE FIGURES

FIGS. 9-10B are perspective views of an electronic device including a vertically protruding semiconductor structure opposite a partial-polarization material in some embodiments according to the invention.

FIG. 13A-C are graphs illustrating the distribution of values for weights W1, W2, and W3 obtain after training with the base model in some embodiments according to the invention.

FIG. 16 is a table listing ideal prior art RPU specifications used to achieve a 2.3% test accuracy, compared with the polarization-based RPU in some embodiments according to the invention.

DETAILED DESCRIPTION OF EMBODIMENTS

Exemplary embodiments of the present disclosure are described in detail with reference to the accompanying drawings. The disclosure may, however, be exemplified in many different forms and should not be construed as being limited to the specific exemplary embodiments set forth herein. Rather, these exemplary embodiments are provided so that this disclosure will be thorough and complete, and will fully convey the scope of the disclosure to those skilled in the art.

Figure 1:
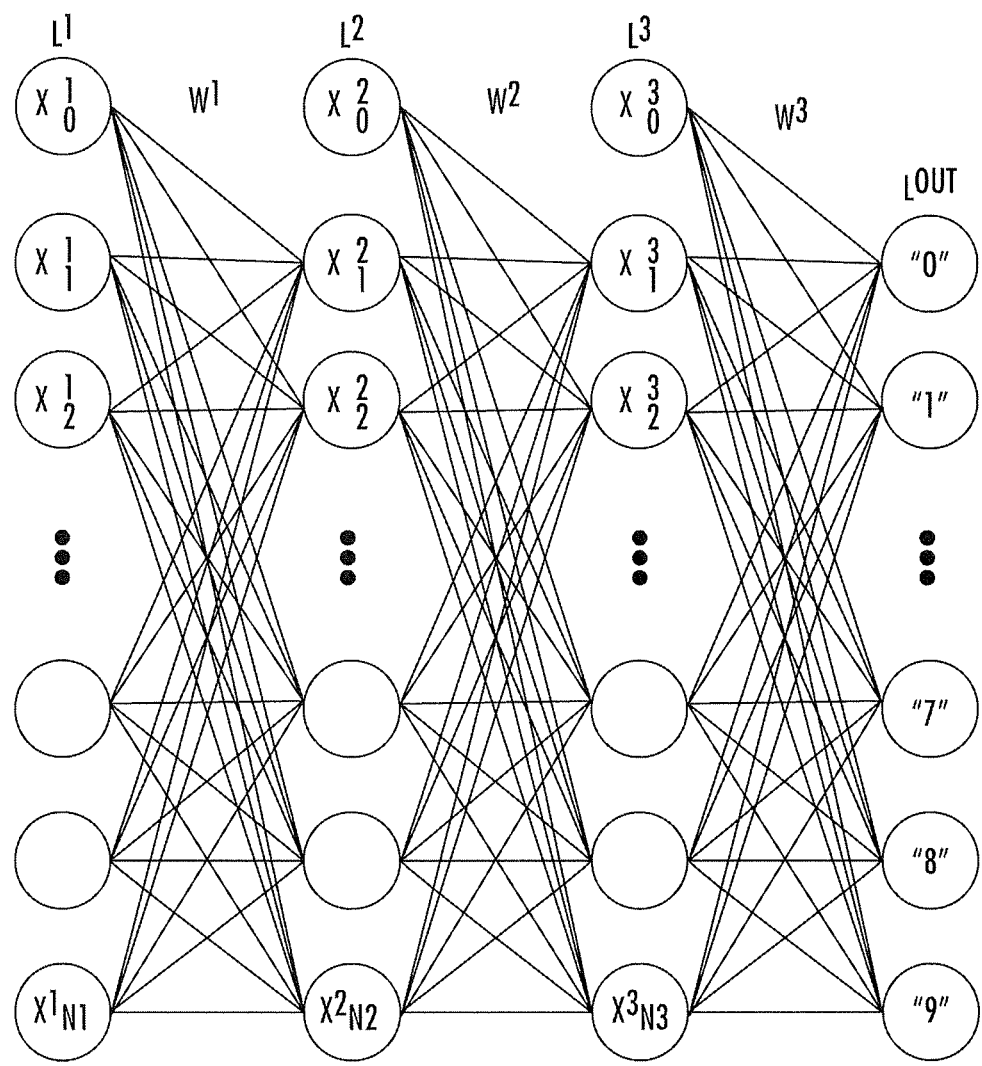
FIG. 1 is a schematic drawing of a Deep Neural Network (DNN) having 4 layers of neurons (L'), using diode connected partial-polarization electronic devices to implement a Resistive Processing Unit (RPU) wherein voltage signals are applied in the upstream layer (L1) and a resulting current is integrated in the downstream layer (L2) in some embodiments according to the invention.

FIG. 1 shows a Deep Neural Network (DNN) having 4 layers of neurons L1-L4 that are connected to subsequent layers by a weight matrix ($W^i$) with two layers of N2 and N3 neurons (sometimes referred to as hidden layers) and an output layer with 10 neurons 0-9. Each layer has a bias unit $x_0^L=1$. Layer numbers are indicated by superscript, whereas neuron rows are indicated by subscript. Each neuron receives a weighted sum of the neurons in the previous layer and can compute a sigmoid activation function $f(z)$, bounded between 0 and 1. The DNN shown in FIG. 1 can use diode connected partial-polarization electronic devices to implement an RPU in some embodiments according to the invention.

Figure 2:
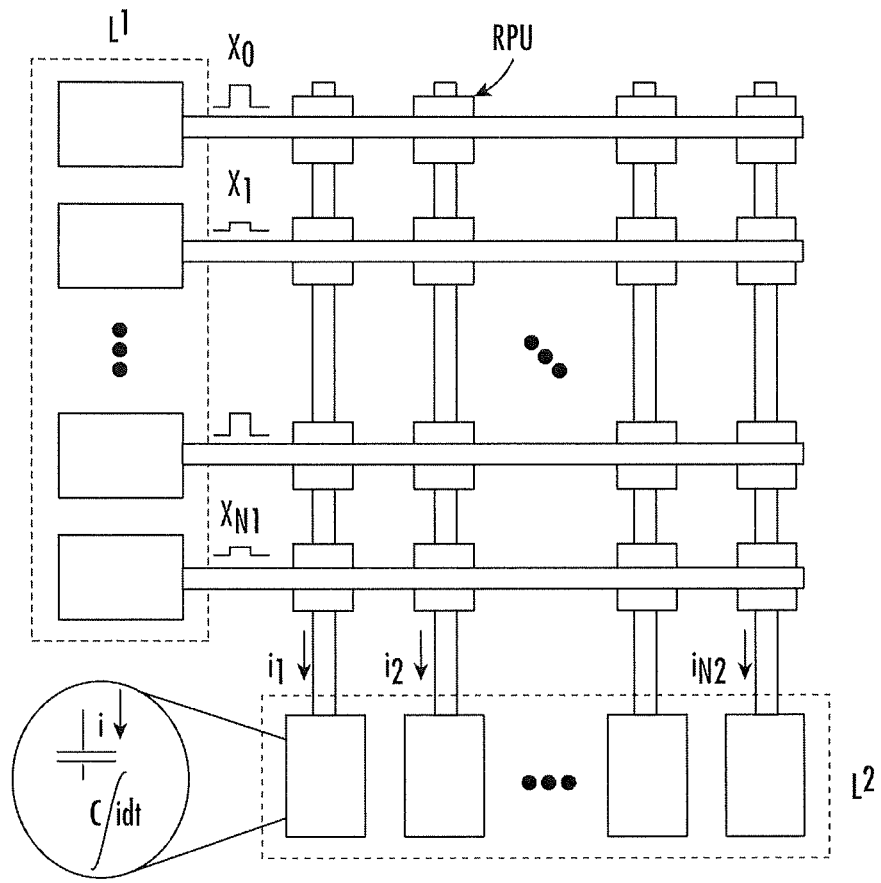
FIG. 2 is a schematic drawing of an RPU using diode connected partial-polarization electronic devices in some embodiments according to the invention.

FIG. 2 is a schematic drawing that illustrates an RPU implementation of a DNN, where each layer of neurons is connected to the next layer in a crossbar array of RPUs. It will be understood that the RPUs can be diode connected partial-polarization electronic devices as illustrated in, for example FIGS. 6-10B, in some embodiments according to the invention. In particular, the depicted example shows that voltage inputs are generated from L1 neurons and the resulting current is integrated by L2 neurons to perform the equivalent of a weighted sum. The backwards cycle can then be performed by applying the inputs from L2 and integrating in L1.

Figure 3:
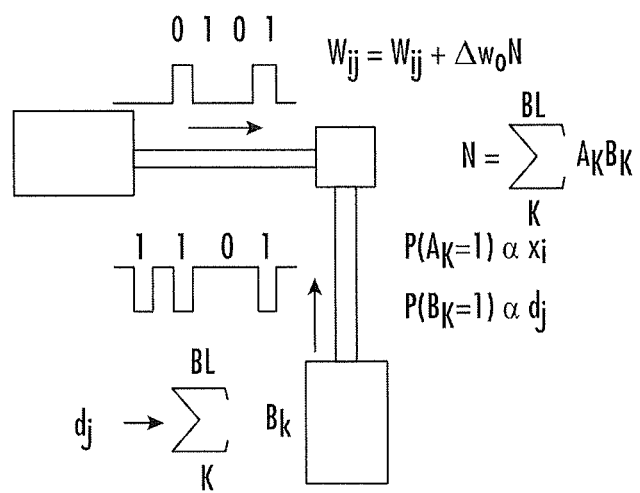
FIG. 3 illustrates a weight update operation implemented using stochastic multiplication in some embodiments according to the invention.

FIG. 3 illustrates a weight update operation implemented using stochastic multiplication in some embodiments according to the invention. According to FIG. 3, the analog values $x_i$ and $\delta_j$ can be converted into stochastic bit streams of length BL. The RPU weight can increase by $\Delta w_o$ for each coincidence of pulses. The weight can be decreased by inverting the polarity of the pulses.

In the forward operation, an input vector is applied at the first layer ($L^1$). Each of the neurons in the next layer measures a weighted sum of the input and produces a nonlinear activation function $f(z)$ that will be the input of the following layer. The signal is propagated until the last layer ($L^{OUT}$), where the neuron with the highest output indicates the classification given by the network. A trained network can perform the forward operation to carry out classification tasks.

The training of the DNN can be performed by the back-propagation algorithm using three operations: 1) the forward operation; 2) the backwards cycle, in which the error measured at the output is given as an input to the last, output layer $L^{out}$, and allowed to propagate back to the first layer $L^1$ in the same manner as in the forward cycle; and 3) the weight update, performed by the rule:

$$w_{ij}^L = w_{ij}^L - \eta x_i^L \delta_j^{L+1}, \quad (1)$$

where $w_{ij}^L$ is the weight that connects the neuron i in layer L (pre-neuron) to the neuron j in layer L+1 (post-neuron), $x_i$ is the pre-neuron output, $\delta_j^{L+1}$ is the back-propagated error fed by the post-neuron, and $\eta$ is the learning rate.

Figure 4:
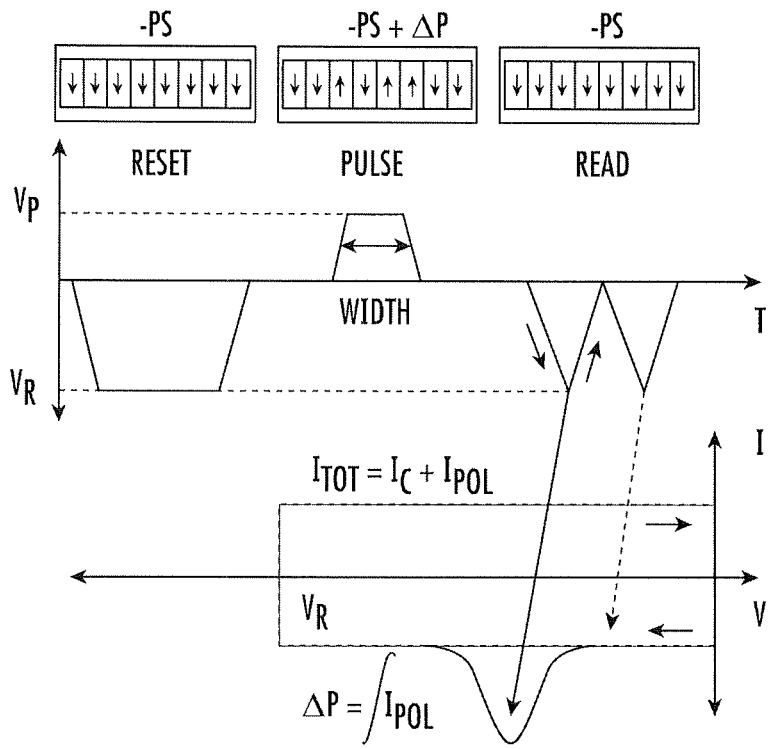
FIG. 4 is an illustration of a partial polarization operation of a 10 nm thick TiN/HZO/TiN capacitor in some embodiments according to the invention.
Figure 5:
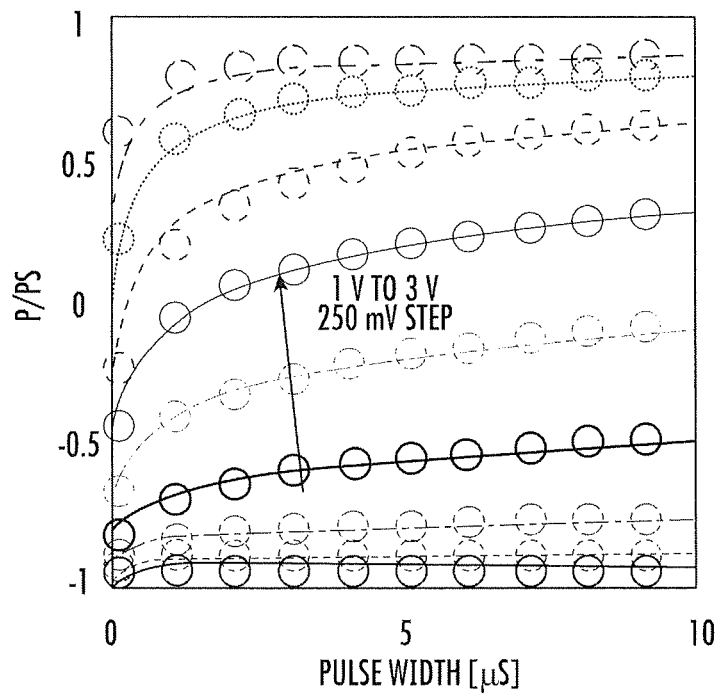
FIG. 5 is a graph illustrating measured ferroelectric polarization (circles) and fitted model ferroelectric polarization (lines) of the capacitor of FIG. 4 in some embodiments according to the invention.
Figure 11A:
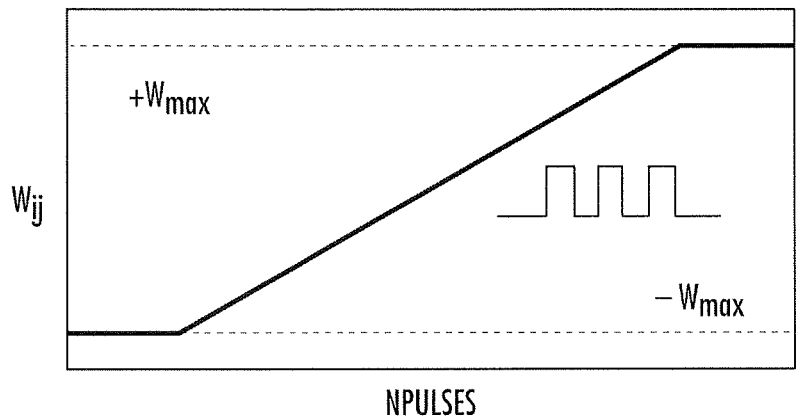
FIG. 11A-C are comparative graphs that illustrate saturation behavior of weighting.
Figure 11B:
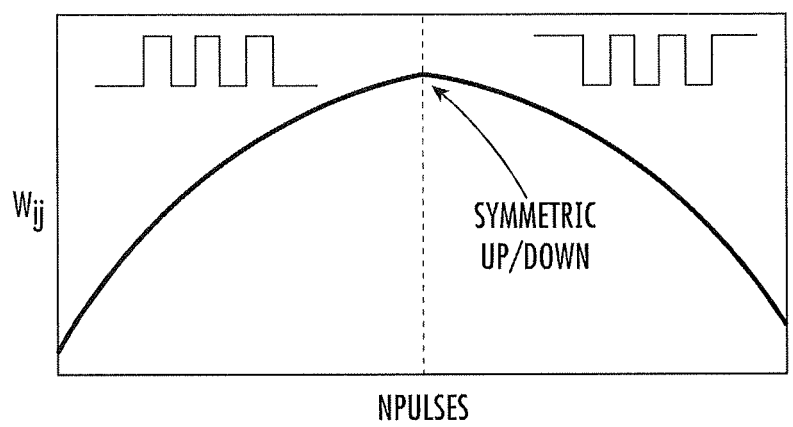
Figure 11C:
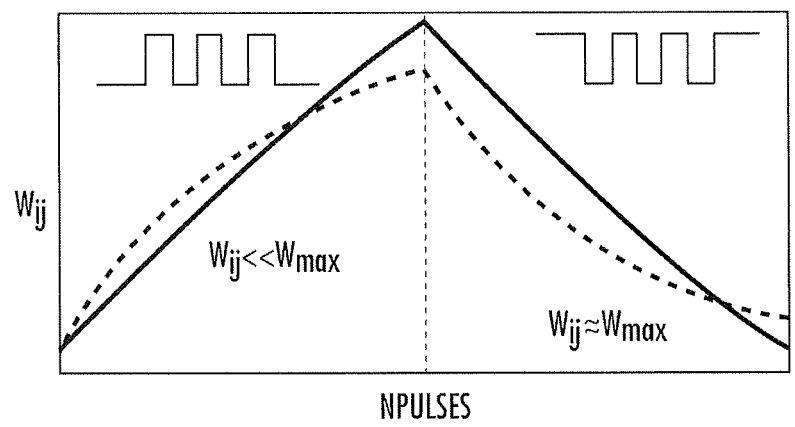

FIG. 4 shows measurements of the ferroelectric polarization of an exemplary 10-nm thick TiN/HfZrO2/TiN capacitor, which can be partially polarized with pulses ranging from 2 to 3 volts, whereas pulses below 1 V can be used for readout in some embodiments. As shown in FIG. 5, measurements of the partial polarization of the exemplary capacitor show an exponential settling, similar to that observed with ions. Some approaches may consider an ideal saturation and only nonlinearities that keep the up/down symmetry, as shown in FIGS. 11A and 11B, respectively. In particular, as shown in FIG. 11A, the weights saturate at values ±wmax without affecting the shape of the curve before saturation, whereas in FIG. 11B nonlinearities provide a symmetric up/down behavior. In FIG. 11C shows a typical nonlinear behavior observed in ferroelectrics and ionic memories, where the states evolve exponentially towards the saturation level. The up/down behavior is symmetric at zero polarization, and becomes asymmetric as the states approach the maximum polarization.

Figure 6:
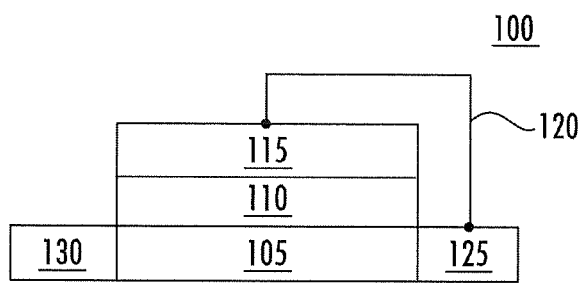
FIGS. 6-8 are cross-sectional views of an electronic device including a planar semiconductor opposite a partial-polarization material in some embodiments according to the invention.
Figures 7, 8:
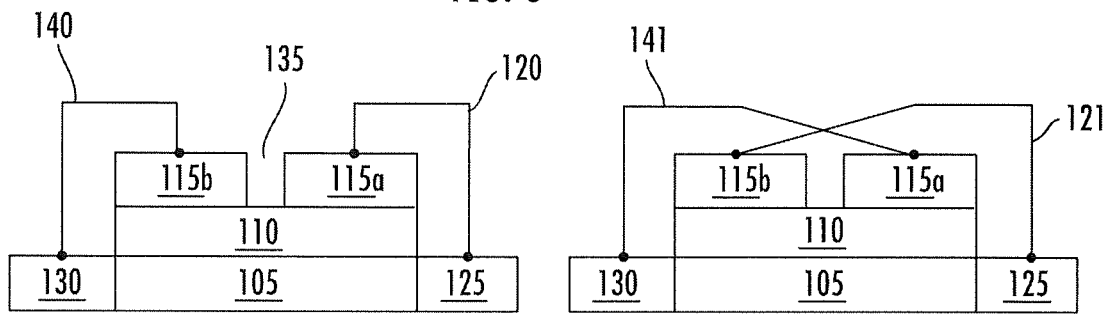

FIGS. 6-8 are cross-sectional views of an electronic device including a planar semiconductor opposite a partial-polarization material in some embodiments according to the invention. As shown in the configurations of FIGS. 6-8 the device can be configured to appear similar to a MOSFET with an internally connected gate and drain in some embodiments. The polarization of the partial-polarization material can be altered by applying voltage pulses between the contacts at biases great enough to partially-polarize the ferroelectric or displace ions. The conductance state of the semiconductor channel can be determined (or "read out") using a low voltage that does not disturb the partial-polarization state so that the level of polarization remains substantially unchanged.

FIGS. 6-8 are cross sectional views of partial polarization electronic devices having planar channel regions in some embodiments according to the invention. According to FIG. 6, the partial-polarization electronic device 100 includes a semiconductor material 105 that is generally planar and includes a channel region that extends between a drain contact 125 and a source contact 130 located on either end of the semiconductor material. It will be understood that the semiconductor material can be any semiconductor material that is suitable for use in resistive type electronic devices as described herein, such as silicon.

It will be further understood that each of the drain contact 125 and the source contact 130 can be ohmically connected to a respective portion of the semiconductor material 105. When the channel region is formed in the semiconductor material 105, a current can flow in the channel region from the drain 125 to the contact 130. It will be understood that the current in the channel region is responsive to a voltage that is applied between the source and drain contacts. The resistance provided by the channel region is responsive to the level of polarization of a partial-polarization material 110 that is on the semiconductor material 105 opposite the channel region. In particular, the partial-polarization material 110 is located on the semiconductor material 105 opposite the channel region and responds to a program voltage applied between the source contact 130 and the drain contact 125 to change the polarization of the partial-polarization material 110 as described above in reference to FIGS. 4 and 5. For example, in operation, a voltage can be applied to the drain contact 125 and the source contact 130 to change the level of polarization exhibited by the partial polarization material 110 as shown for example in FIGS. 4 and 5 above. Changing the level of polarization of the partial-polarization material 110 can set the resistance provided by the channel region in the semiconductor material 105.

As further shown in FIG. 6, the gate contact 115 is located on the partial-polarization material 110 and is ohmically coupled to the drain contact 125 to place the electronic device 100 in what is sometimes referred to as a diode-connected configuration. Accordingly, when the voltage is developed across the source contact 130 and the drain contact 125, the voltage is also developed between the source contact 130 and the gate contact 115 which (when the voltage is great enough) can change the polarization level of the partial-polarization material 110. When the voltage is developed across the source contact 130 and the drain contact 125, the same voltage is provided to the gate contact 115. When a programming voltage level is provided between the source contact 130 and the drain contact 125/gate contact 115, the polarization level of the partial-polarization material 110 can modify the resistance of the channel region. When a read voltage is applied to the device 100, the current that flows in the channel region is responsive to the resistance, which indicates the polarization level of the partial-polarization material 110.

FIGS. 7 and 8 are cross sectional views of partial-polarization electronic devices 100 having first and second gate contacts which are provided in various ohmic configurations relative to the source and drain contacts in some embodiments according to the invention. According to FIG. 7, the gate contact is separated into a first gate contact 115a and a second gate contact 115b, both of which are located on the partial-polarization material 110 and are electrically isolated from one another by a void 135. It will be understood that the void may include any material that electrically isolates the first gate contact 115a and the second gate contact 115b from one another.

As further shown in FIG. 7, the first gate contact 115a is ohmically connected to the drain contact 125 and the second gate contact 115a is ohmically connected to the source contact 130. As shown in FIG. 8, the first gate contact 115a is ohmically coupled to the source contact 130 whereas the second gate contact 115b is ohmically coupled to the drain contact 125.

Figures 9, 10A:
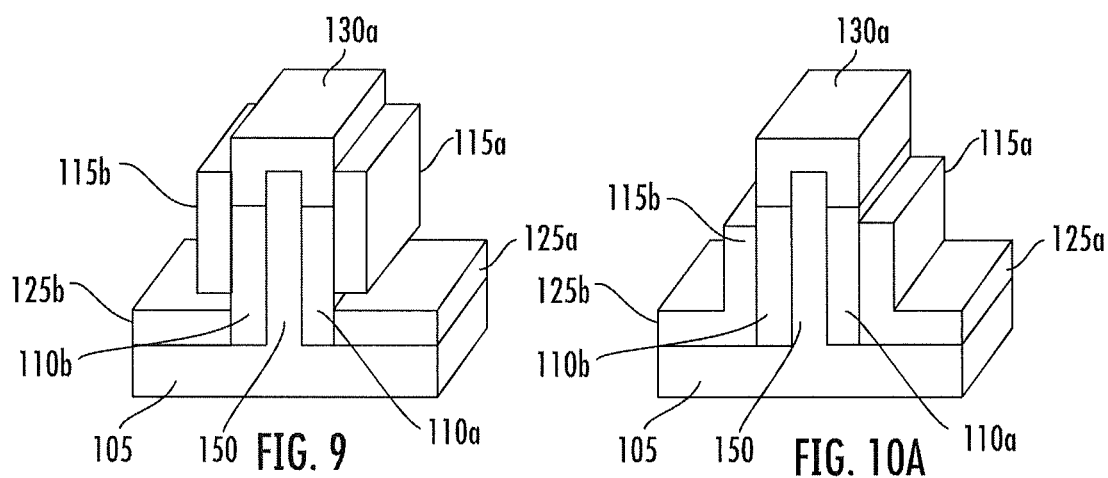
Figure 10B:
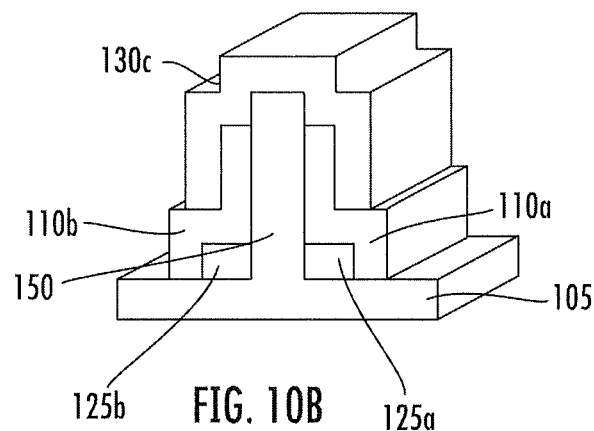

FIGS. 9, 10A, and 10B are perspective views of partial-polarization electronic devices 100 including vertically protruding structures protruding from the semiconductor material which provide the channel region therein in some embodiments according to the invention. The partial-polarization material is provided in two separate layers located on opposite sides of the vertically protruding structure 150. In particular, a first partial polarization material 110a is located on a first vertical side wall of the vertically protruding structure 150 and a second partial-polarization material 110b is located on an opposing vertical side wall of the vertically protruding structure 150. The first and second partial-polarization materials 110a-b extend upward from the base of the vertically protruding structure 150 to just short of an upper most portion of the vertically protruding structure 150.

As further shown in FIG. 9, a first drain contact 125a is located on the semiconductor material 105 and is ohmically coupled to a base of the first partial-polarization material 110a whereas a second drain contact 125b is ohmically coupled to a base of the second partial-polarization material 110b. The uppermost portion of the vertically protruding structure is covered by a source contact 130a which extends downward along the vertical side walls of the vertically protruding structure 150 to meet the respective upper most portions of the first and second partial-polarization materials 110a-b.

As further shown in FIG. 9, first and second gate contacts 115a-b are located on the first and second the partial-polarization materials 110a and 110b, respectively and overlap the source contact 130a. Accordingly, the first and second gate contacts 115a-b are ohmically coupled to the source contact 130a and are electrically isolated from the first and second drain contacts 125a-b.

FIG. 10A illustrates that, in some embodiments, the first and second drain contacts 125a-b can extend onto the vertical side walls of the first and second partial polarization materials 110a-b to also provide the first and second gate contacts 115a-b. As further shown in FIG. 10A, the source contact 130a is electrically isolated from the first and second gate contacts 115a-b and the first and second drain contacts 125a-b.

FIG. 10B is a perspective view of yet another embodiment of a vertically protruding structure configuration for a partial-polarization electronic device 100 in some embodiments according to the invention. According to FIG. 10B, the first and second drain contacts 125-b are both ohmically connected to vertical side walls of the vertically protruding structure 150 and to the first and second partial-polarization materials 110a-b, which can extend over the first and second drain contacts 125a-b respectively to contact the semiconductor material 105. Still further, the upper portions of the first and second partial polarization materials 110a-b both extend onto the vertical side walls of the vertically protruding structure 150 above the first and second drain contacts 125a-b. The source contact 130c extends over an uppermost portion of the vertically protruding structure 150 onto the outer surfaces of the first and second partial-polarization materials 110a-b.

Experimental Data

Figure 12:
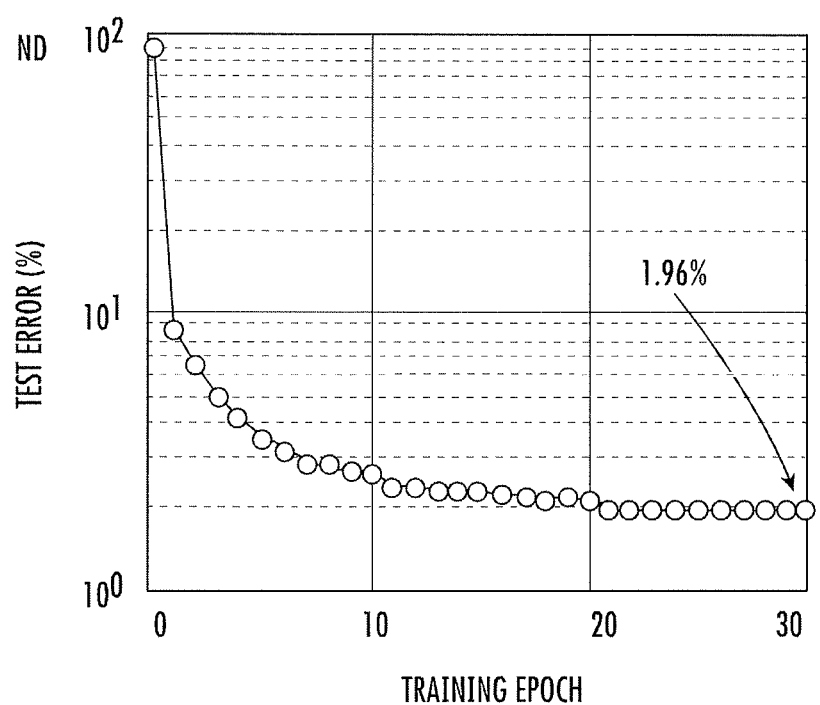
FIG. 12 is a graph that shows the training error achieved using the ideal update rule of Equation (1) in some embodiments according to the invention.

The DNN in FIG. 1 was implemented for classification of a MNIST dataset of handwritten digits. The dataset included 60,000 images for training and 10,000 test images that were used to evaluate the network performance. The input layer size was 784 (28×28 pixels, normalized between 0 and 1), followed by two hidden layers with 256 and 128 neurons, and an output layer with 10 neurons for labels from 0 to 9. Sigmoid activation functions where used in hidden layers, softmax activations at the output and log-likelihood cost function. The base model was implemented with the ideal weight update in (1) and achieved 1.96% accuracy on the test set of FIG. 12.

For the stochastic weight update, see for example FIGS. 2 and 3, the following rule was used:

$$w_{ij}^L = w_{ij}^L \mp \Delta w_0 N, \qquad (2)$$

where N is the number of pulse coincidences, and $\Delta w_0$ is the nominal weight update. The exponential behavior shown in FIG. 11C was modeled by modifying the update rule as:

$$w_{ij}^L = w_{ij}^L \mp \Delta w_0 N \left(1 \pm \frac{w_{ij}^L}{w_{max}}\right), \qquad (3)$$

where $w_{max}$ is the device saturation point. The number of levels used for the RPU can be determined by the largest $\Delta w_0$ and smallest $w_{max}$ that can be simultaneously tolerated.

FIG. 13A shows the distribution of values in the weight matrices $W^1$, $W^2$ and $W^3$ obtained after training with the base model. Given that the input of a neuron was computed as the weighted sum of the output from the previous layer, the weights tend to scale inversely as the number of elements on each layer.

In some embodiments, the weighted sums performed by the neurons can be scaled in the forward and backward cycles, which can be done at the hardware level by changing the gain during integration. The weight update can be scaled back by changing the scale factors in the random bit generators. Both scaling steps are common to all neurons in a layer and do not affect the parallel operation. Two layer-normalization rules were tested, as depicted in FIGS. 13B and 13C. The normalization is transparent to the algorithm, so all cases achieve the same performance when the ideal update rule in (1) is applied, and only become relevant when nonidealities are introduced.

Figure 14A:
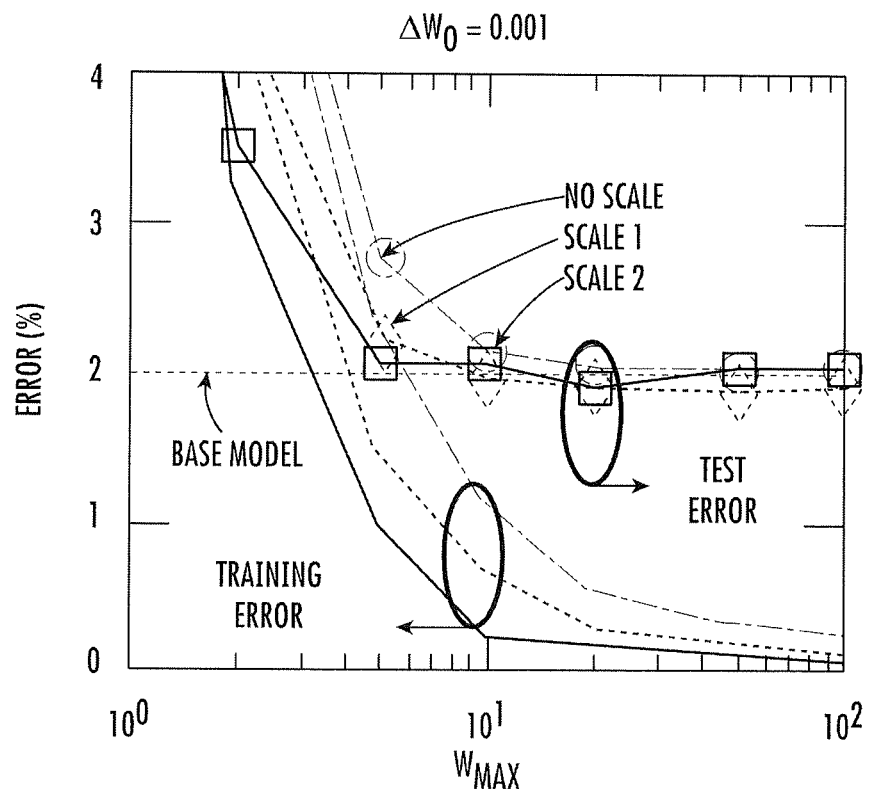
FIG. 14A-C are graphs illustrating test and training error obtained after 30 epochs with the weight update rule in eq (3) for a) $\Delta w_o=0.001$, b) $\Delta w_o=0.005$ and c) $\Delta w_o=0.01$ in some embodiments according to the invention.
Figure 14B:
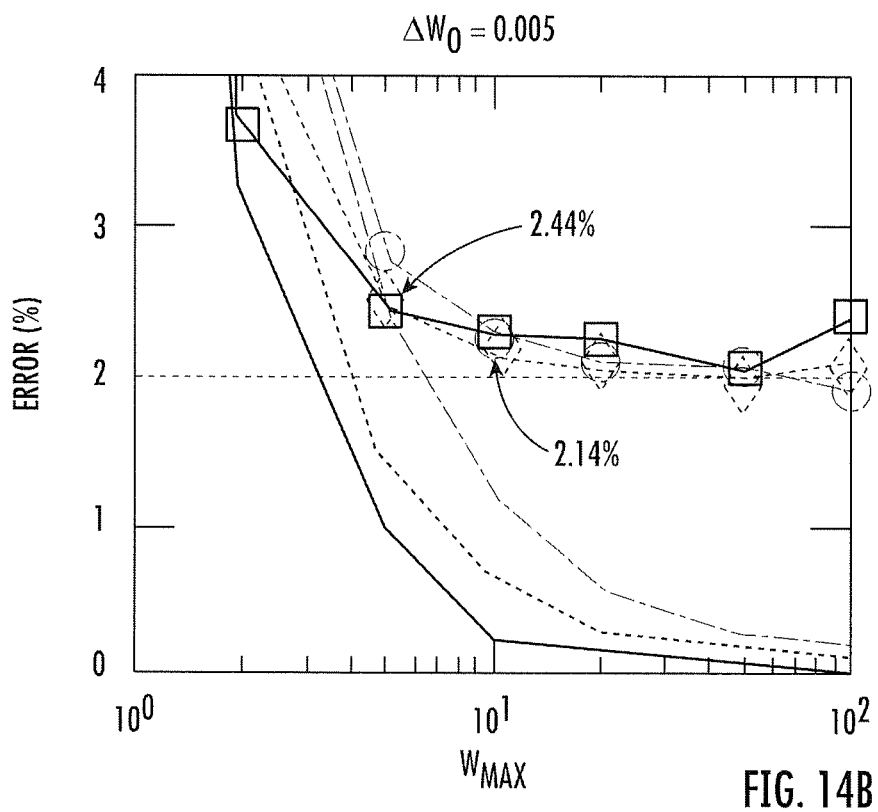
Figure 14C:
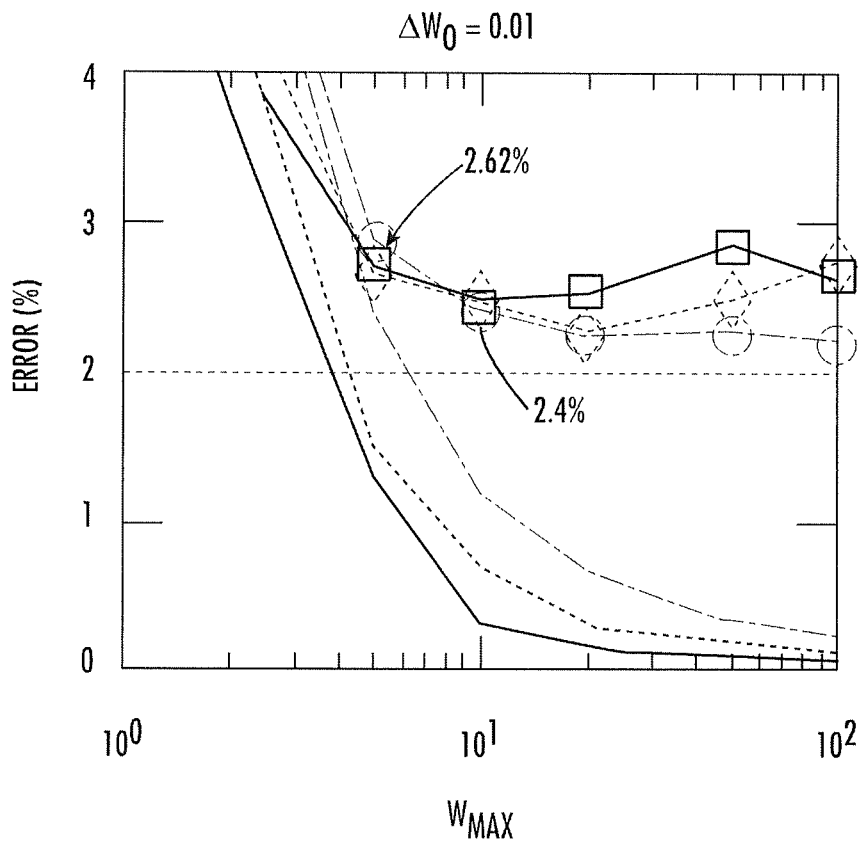

FIGS. 14A-C shows the performance of the neural network after 30 epochs (i.e. iterations of the 60,000 training images), measured as the percentage of mislabeled images. The three scale rules were evaluated using the update rule in equation (3) with $\Delta w_o = 0.001$, 0.005 and 0.01, and saturation values $w_{max}$ from 1 to 100. The scaling effectively reduces the impact of saturation for small $w_{max}$, but is also more sensible to the nominal weight update $\Delta w_o$: for $\Delta w_o = 0.001$, the scale rule 2 achieves a lower error for the full range of $w_{max}$, whereas when $\Delta w_o = 0.01$ the unsealed weights perform better for $w_{max} > 10$. Scale rule 1 achieves a good overall performance due to the balance between these two factors: a test error of 2.14% is obtained with 4000 levels, and 2.62% with 1000 levels.

In all cases, the error on the training set is monotonically reduced as the saturation $w_{max}$ increases, but in some embodiments, the test error can increase for large values of $w_{max}$. This is caused by the non-systematic asymmetry that favors updates towards zero than to the extreme values $\pm w_{max}$, and therefore disfavors large weights. When the nominal weight update is small enough not to affect the performance ($\Delta w_o = 0.001$), an improvement over the base model was observed due to this regularization effect.

Figure 15:
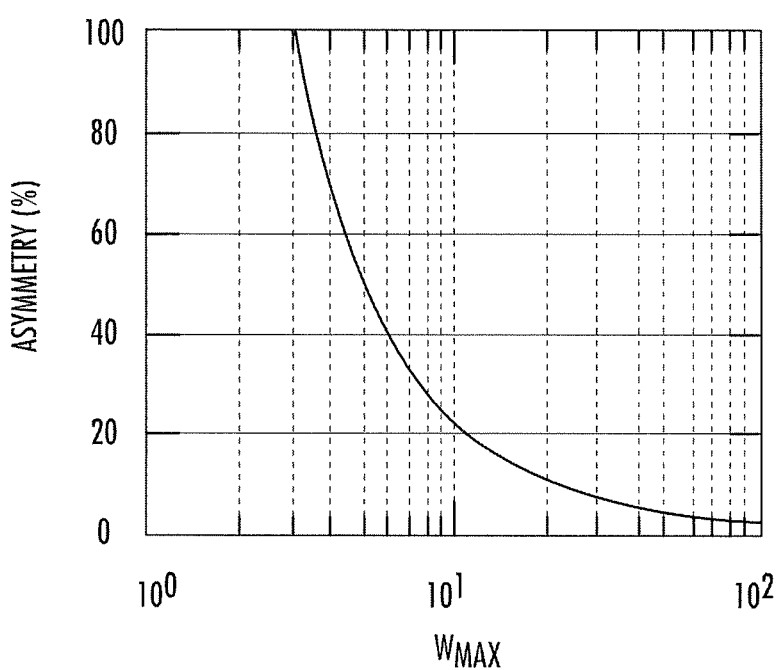
FIG. 15 is a graph that shows non-systematic asymmetry as a function of the weight saturation value $w_{max}$, computed from the update rule in equation (3) for a weight $w_{ij}^L=1$ in some embodiments according to the invention.

A measure of the non-systematic asymmetry obtained with the update rule in equation (3) is shown in FIG. 15, computed for a weight $w_{ij}^L = 1$, which is within the range of weight values obtained after training. A 20% up/down asymmetry is obtained for $w_{max} = 10$ and up to 50% for $w_{max} = 5$, with errors of 2.14 and 2.62% respectively.

FIG. 16 is a table listing prior art RPU specifications used to achieve a 2.3% test accuracy, compared with the polarization-based RPU in some embodiments according to the invention. According to FIG. 16, simulations of a symmetric PCM show a 3% test error, but real devices show a large systematic asymmetry that limits practical use. The CMOS based RPU achieves a good performance, but it is limited by the capacitor leakage, which requires a large area. The proposed polarization-based RPU can achieve a low error and tolerate a large non-systematic asymmetry while keeping realistic area constrains. The device area for the polarization-based RPU is estimated assuming a planar ferroelectric with a grain dimension of 10 nm. A smaller area could be achieved with ions or in a vertical fin structure.

In the drawings, the shapes and dimensions of elements may be exaggerated for clarity, and the same reference numerals will be used throughout to designate the same or like elements. It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated elements but do not preclude the presence or addition of one or more other elements.

While exemplary embodiments have been shown and described above, it will be apparent to those skilled in the art that modifications and variations could be made without departing from the spirit and scope of the present disclosure as defined by the appended claims.

What is claimed:

1. An electronic device comprising:
   a semiconductor material including a channel region configured to conduct a current;
   a source contact electrically coupled to the channel region at a first location;
   a drain contact electrically coupled to the channel region at a second location spaced apart from the first location;
   a partial-polarization material on the semiconductor material between the source contact and the drain contact opposite the channel region; and
   a gate contact on the partial-polarization material opposite the channel region and ohmically coupled to the drain contact or ohmically coupled to the source contact, wherein the electronic device is configured to set a partial-polarization state of the partial-polarization material by applying a programming voltage pulse or sequence of pulses between the drain contact and the source contact to set the partial-polarization state of the partial-polarization material.

2. The electronic device of claim 1 wherein the gate contact comprises a first gate contact extending on the partial-polarization material to about half a length of the channel region, the electronic device further comprises:
   a second gate contact extending on the partial-polarization material opposite the channel region and ohmically coupled to the source contact; and a void between the second gate contact and the first gate contact on the partial-polarization material at about a mid-point of the length of the channel region, the void electrically isolating the second gate contact from the first gate contact.

3. The electronic device of claim 2 wherein the source contact is ohmically coupled to the first gate contact and the drain contact is ohmically coupled to the second gate contact.

4. The electronic device of claim 1 wherein the partial-polarization material comprises a ferroelectric material.

5. The electronic device of claim 1 wherein the partial-polarization material comprises doped hafnium oxide.

6. The electronic device of claim 1 wherein the partial-polarization material comprises an ion doped polymer.

7. The electronic device of claim 1 wherein the semiconductor material includes a vertically protruding structure providing the channel region and having opposing first and second vertical side walls, and the source contact comprises a first source contact the electronic device further comprising:
wherein the partial-polarization material is located on side walls the vertically protruding structure to provide first and second vertical side walls of the partial-polarization material
a second source contact is on the semiconductor material and ohmically coupled to a base of the second vertical side wall opposite the first source contact on the semiconductor material and ohmically coupled to a base of the first vertical side wall; and
wherein the drain contact is ohmically coupled to an uppermost surface of the vertically protruding structure and extends on the first and second vertical side walls of the partial-polarization material to provide the gate contact.

8. The electronic device of claim 1 wherein the semiconductor material includes a vertically protruding structure providing the channel region and having opposing first and second vertical side walls, and the source contact comprises a first source contact the electronic device further comprising:
wherein the partial-polarization material is located on side walls the vertically protruding structure to provide first and second vertical side walls of the partial-polarization material
a second source contact is on the semiconductor material and is ohmically coupled to a base of the second vertical side wall opposite the first source contact and extends on the second vertical side wall toward the drain contact to provide a second gate contact;
wherein the first source contact is on the semiconductor material and is ohmically coupled to a base of the first vertical side wall and extends on the first vertical side wall toward the drain contact to provide a first gate contact; and
wherein the drain contact is ohmically coupled to an uppermost surface of the vertically protruding structure.

9. The electronic device of claim 1 wherein the channel region is planar.

10. The electronic device of claim 1 wherein the source contact is ohmically coupled to the channel region at the first location and the drain contact is ohmically coupled to the channel region at the second location.

11. The electronic device according to claim 1 wherein the electronic device comprises at least one of a plurality of partial-polarization electronic devices each being arranged in a diode-connected configuration.

12. The electronic device according to claim 11 further comprising:
a plurality of serially connected layers of a neural network circuit, wherein each layer includes a respective plurality of neurons; and
a plurality of resistive processing cross-bar circuits, wherein each of the resistive processing cross-bar circuits is connected between directly adjacent ones of the serially connected layers to provide a respective weighting to data provided from the respective plurality of neurons included in an upstream layer of the neural network circuit that is summed by a down-stream layer of the neural network circuit.

13. The electronic device according to claim 12 each of the resistive processing cross-bar circuits comprise a respective array of the partial-polarization electronic devices.

14. The electronic device of claim 1 wherein the electronic device is configured to read the partial-polarization state by applying a read voltage to generate a current in the channel region responsive to the partial-polarization state.

15. A method of operating an electronic device, the method comprising:
applying a programming voltage pulse or sequence of pulses between a drain contact and a source contact to set a partial-polarization state of a partial-polarization material opposite a channel region in a semiconductor material, wherein the source contact is electrically coupled to the channel region at a first location and the drain contact is electrically coupled to the channel region at a second location spaced apart from the first location;
the partial-polarization material is between the source contact and the drain contact opposite the channel region; and
a gate contact is on the partial-polarization material opposite the channel region and ohmically coupled to the drain contact or ohmically coupled to the source contact.

16. The method of claim 15 wherein the gate contact comprises a first gate contact extending on the partial-polarization material to about half a length of the channel region, the electronic device further comprises:
a second gate contact extending on the partial-polarization material opposite the channel region and ohmically coupled to the source contact; and
a void between the second gate contact and the first gate contact on the partial-polarization material at about a mid-point of the length of the channel region, the void electrically isolating the second gate contact from the first gate contact.

17. The method of claim 16 wherein the source contact is ohmically coupled to the first gate contact and the drain contact is ohmically coupled to the second gate contact.

18. The method of claim 15 wherein the partial-polarization material comprises a ferroelectric material.

19. The method of claim 15 wherein the partial-polarization material comprises doped hafnium oxide.

20. The method of claim 15 further comprising:
applying a read voltage to generate a current in the channel region responsive to the partial-polarization state.

* * * * *